(12) United States Patent
Hartman

(10) Patent No.: US 12,242,318 B2
(45) Date of Patent: Mar. 4, 2025

(54) SYSTEM AND METHOD FOR MANAGING CONNECTOR POSITIONING IN DATA PROCESSING SYSTEMS

(71) Applicant: Dell Products L.P., Round Rock, TX (US)

(72) Inventor: Corey Dean Hartman, Hutto, TX (US)

(73) Assignee: Dell Products L.P., Round Rock, TX (US)

( * ) Notice: Subject to any disclaimer, the term of this patent is extended or adjusted under 35 U.S.C. 154(b) by 268 days.

(21) Appl. No.: 18/159,921

(22) Filed: Jan. 26, 2023

(65) Prior Publication Data

US 2024/0256015 A1 Aug. 1, 2024

(51) Int. Cl.
G06F 1/20 (2006.01)
H05K 7/20 (2006.01)

(52) U.S. Cl.
CPC ......... *G06F 1/206* (2013.01); *H05K 7/20172* (2013.01); *H05K 7/20718* (2013.01)

(58) Field of Classification Search
CPC . G06F 1/206; H05K 7/20172; H05K 7/20718
USPC ...................................... 361/679.48
See application file for complete search history.

(56) References Cited

U.S. PATENT DOCUMENTS

| | | | |
|---|---|---|---|
| 7,308,705 B2 | 12/2007 | Gordy et al. | |
| 7,970,279 B2 | 6/2011 | Dress | |
| 9,331,899 B2 | 5/2016 | Christopher et al. | |
| 9,684,575 B2 | 6/2017 | Breakstone et al. | |
| 10,019,388 B2 | 7/2018 | Long et al. | |
| 10,261,561 B2 | 4/2019 | Chuang et al. | |
| 10,733,116 B2 | 8/2020 | Litichever et al. | |
| 11,029,742 B2 | 6/2021 | Webel et al. | |
| 11,112,846 B2 | 9/2021 | Strach et al. | |
| 2008/0126629 A1 | 5/2008 | Huang | |
| 2009/0300329 A1 | 12/2009 | Naffziger et al. | |
| 2016/0095263 A1* | 3/2016 | Campbell | H05K 7/20172 454/184 |
| 2017/0147052 A1 | 5/2017 | Waters et al. | |
| 2019/0069442 A1* | 2/2019 | Pav | G06F 1/20 |
| 2021/0235599 A1* | 7/2021 | Illingworth | H05K 7/20727 |
| 2022/0130432 A1 | 4/2022 | Jayapal et al. | |

(Continued)

OTHER PUBLICATIONS

"DC-MHS R1 Overview," 2022 OCP Global Summit (56 Pages).

(Continued)

*Primary Examiner* — Zhengfu J Feng
(74) *Attorney, Agent, or Firm* — Womble Bond Dickinson (US) LLP

(57) ABSTRACT

Methods and systems for managing the operation of data processing systems are disclosed. A data processing system may include a computing device that may provide computer implemented services. To provide the computer implemented services, hardware components of the data processing system may need to operate in predetermined manners. To manage the operation of the hardware components, the data processing system may cool them when their temperatures fall outside of thermal operating ranges. To facilitate cooling, fans generate flows of gasses. A fan carrier assembly may be used to automatically align plugs of fans with power receptacles during insertions of the plugs into the receptacles.

20 Claims, 12 Drawing Sheets

(56) References Cited

U.S. PATENT DOCUMENTS

2023/0309254 A1* 9/2023 Liu .................. H05K 7/20727

OTHER PUBLICATIONS

Kennedy, Jeff et al., "Peripheral Sideband Tunneling Interface (M-PESTI)," Datacenter—Modular Hardware Systems (DC-MHS) Rev 1.0, Apr. 27, 2022 (50 Pages).

"Why won't the computer wake up when connected over USB," Belkin Official Support, Web Page <https://www.belkin.com/support-article/?articleNum=8130>, accessed on Oct. 17, 2022 (2 Pages).

"Clock Gating for Power Reduction," CoQube Analytics and Services, 2021, Web Page <https://coqube.com/clock-gating-for-power-reduction/>, accessed on Oct. 17, 2022 (12 Pages).

Kennedy, Patrick, "Liquid Cooling Next-Gen Servers Getting Hands-on with 3 Options," ServeTheHome, Aug. 2, 2021, Web Page <https://www.servethehome.com/liquid-cooling-next-gen-servers-getting-hands-on-3-options-supermicro/4/>, accessed on Oct. 17, 2022 (10 Pages).

* cited by examiner

SYSTEM AND METHOD FOR MANAGING CONNECTOR POSITIONING IN DATA PROCESSING SYSTEMS

FIELD OF THE EMBODIMENTS

Embodiments disclosed herein relate generally to thermal management of devices. More particularly, embodiments disclosed herein relate to systems and methods for providing for flexibility in powering cooling devices.

BACKGROUND

Computing devices may store data and used stored data. For example, computing devices may utilize data when providing computer implemented services. If computing devices are unable to access data, process data, and/or perform other functions, then the computing devices may be unable to provide some, or all, of the computer implemented services desired by users of the computing devices.

BRIEF DESCRIPTION OF THE DRAWINGS

Embodiments are illustrated by way of example and not limitation in the figures of the accompanying drawings in which like references indicate similar elements.

DETAILED DESCRIPTION

Figure 1A:
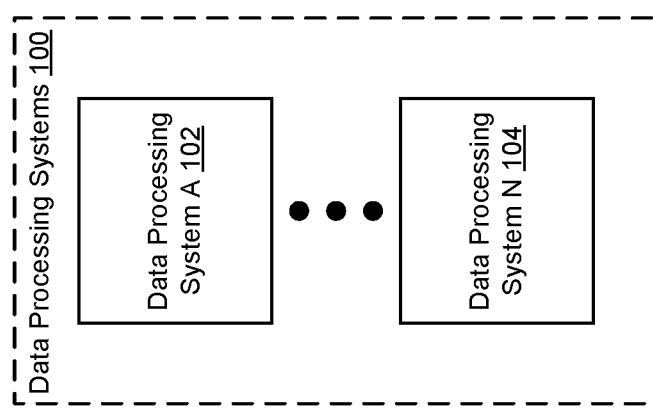
FIG. 1A shows a block diagram illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References in the specification to "adapted to" may, in the context of a programmable device, indicate that the programmable device has been programmed to perform the functionality described with respect to the programmable device. In the context of a static device, "adapted to" may indicate that the device include circuitry to perform the functionality described with respect to the static device.

In general, embodiments disclosed herein relate to methods and systems for providing computer implemented services using data processing systems. To provide the computer implemented services, the data processing system may include hardware components that generate heat. The heat may need to be dissipated for continued operation of the hardware components.

To dissipate heat, the data processing system may include an enclosure that includes areas for fans and the hardware components. To improve the rate of cooling of the hardware components, the fans may generate a flow of gas to cool the hardware components.

The fans may be positioned using fan carrier assemblies. The fan carrier assemblies may provide for repositioning of plugs used to power the fans. By repositioning the plugs, the fans and fan carrier assemblies may be used in fan locations having varying topologies. For example, the locations of receptacles for the plugs within the fan locations may varying.

By doing so, fan carrier assemblies customized for different fan location topologies may not need to be used. Thus, embodiments disclosed herein may address, in addition to other issues, the technical problem of physical compatibility between hardware components. The disclosed embodiments may address this technical problem by providing a fan carrier assembly that is able to conform its structure to different topologies in which the fan carrier assembly may be used.

In an embodiment, a data processing system that provides computer implemented services is provided. The data processing system may include a payload comprising hardware components that provides the computer implemented services; a fan to cool the payload while the hardware components are providing the computer implemented services; and a fan carrier assembly adapted to position a plug through which the fan obtains power to operate, the fan carrier assembly comprising: a connector housing adapted to reposition the plug between a first position and a second position with respect to a body of the fan.

The connector housing may include a slot; and a locating feature coupled to the plug, wherein the locating feature is positioned in the slot.

The slot may restrict motion of the plug to a path between the first position and the second position.

The slot and the locating feature may facilitate free translation of the plug along the path.

The locating feature may include a pin positioned in the slot, and the pin comprises an interface portion that extends out of the slot.

The data processing system may also include a driver feature adapted to align the plug with a receptacle from which the power is available.

The driver feature may align the plug with the receptacle during an approach of the fan carrier toward a fan location in which the receptacle is positioned.

The fan location may define an area in which the fan is positioned.

The locating feature may include an alignment feature comprising a surface that: is skewed with respect to a direction the approach of the fan carrier; and makes an interference with the interface portion during the approach, the interference applying a force to the plug via the interface portion.

The force may translate the plug to the first position or the second position during the approach to align the plug with the receptacle.

Completion of the approach may connect the plug with the receptacle while aligned.

The connector housing may define a bottom surface that is opposite of the receptacle during the approach.

The connector housing may be rotatably connected to the fan by the fan carrier.

The connector housing may also include a return mechanism adapted to return the plug to the first position or the second position while the force is not applied to the plug.

In an embodiment, an enclosure is provided. The enclosure may include a payload area for the hardware components of the data processing system, a fan; and a fan carrier assembly as discussed above.

In an embodiment, a fan carrier assembly is provided as discussed above.

Turning to FIG. 1A, a block diagram illustrating a system in accordance with an embodiment is shown. The system shown in FIG. 1A may provide any quantity and type of computer implemented services. To provide the computer implemented services, the system of FIG. 1A may include data processing systems 100.

All, or a portion, of data processing systems 102-104 may provide computer implemented services to users and/or other computing devices operably connected to data processing systems 100. The computer implemented services may include any type and quantity of services including, for example, database services, instant messaging services, video conferencing services, etc. Data processing systems 100 may provide other types of computer implemented services without departing from embodiments disclosed herein. Data processing systems 100 may each provide similar and/or different computer implemented services, and any of data processing systems 100 may provide any of the computer implemented services in cooperation with other data processing systems and/or independently.

To provide computer implemented services, data processing systems 100 may need to operate in a predetermined manner. The predetermined manner of operation may include, for example, executing an operating system, drivers, and/or other type of management entities that mediate, facilitate, or otherwise operate in a manner which enables the applications to operate (e.g., by providing abstracted access to hardware resources used in the execution of the applications).

To operate in the predetermined manner, data processing systems 100 may perform one or more operations to enter the predetermined manner of operation (by changing from other manners of operation to the predetermined manner of operation). These operations may include, for example, a boot process from a power-on (or reset or other manner of operation that differs from the predetermined manner of operation to the extent that the applications may not be able to operate) to hand off operation management of the data processing system to an operating system or other type of operational management entity that places data processing systems 100 into the predetermined manner of operation. The operating system may, for example, provide abstracted access to resources (e.g., processing resources provided by processors, memory resource provided by memory modules, storage resources provided by storage devices, etc.) utilized by the applications hosted by the data processing system.

For example, consider a scenario where a data processing system has been shut off. After the data processing system is turned on, the data processing system may be operating in a startup manner such that the data processing system is not yet able to support execution of an application (e.g., the application may not be able to successfully execute until the data processing system hosts an operating system or other type of management entity). To enter the predetermine manner of operation conducive to execution of the application, the data processing system may go through a boot process (e.g., a startup) which may be performed by one or more types of management entity such as a basic input-output system and/or other startup management entities. The management entity may perform any number of actions (e.g., a "startup process") to prepare the data processing system to begin execution of an operating system and/or other type of management entity that facilitates execution of applications.

To perform the startup process and provide the computer implemented services, data processing systems 100 may include various hardware components (e.g., integrated circuit-based devices). The hardware components may perform various types of functionalities such as data processing functionality, communication functionality, etc.

When providing their functionalities, any of the hardware components may consume electricity and generate heat. Any of the hardware components may have limitations on their operation. For example, any of the hardware components may have limitations regarding their temperatures (e.g., hardware components having such limitations being referred to as "temperature sensitive hardware components"). The temperature limitations may include an upper temperature limit. If temperatures of the temperature sensitive hardware components fall outside of the upper limit, then the corresponding temperature sensitive hardware components may be impaired (e.g., may not operate, may operate but in an undesirable manner such as including errors in their operation, may be subject to damage if operated, etc.).

In general, embodiments disclosed herein relate to systems, devices, and methods for improving the likelihood that data processing systems 100 are able to provide their computer implemented services. To improve the likelihood that data processing systems 100 are able to provide their computer implemented services, data processing systems 100 may include functionality to cool hardware components.

For example, data processing systems 100 may include fans. The fans may generate a flow of a gas (e.g., air or other ambient gasses, specific mixes of gases, gasses that have been process via heating/cooling/ventilation systems, etc.) which may be used to cool the hardware component.

To facilitate cooling of the hardware components, (i) the fans of the data processing system may be arranged in a specific manner, (ii) fan carrier assemblies may be used to position and arrange the fans, and (iii) the fan carrier assemblies may facilitate automatic positioning of plugs through which power is obtained for the fans with respect to receptacles from which power may be obtained. The plugs may be automatically repositioned during approaches of the fans to locations where the fans will be positioned. The locations may include driver features or other mechanical structures which may establish interferences with portions of the fan carriers during the approaches. The interferences may apply forces to the plugs that align them with corresponding receptacles. Consequently, the fans may be able to obtain power for operation using receptacles located in a variety of different positions with respect to locations in which the fans are positioned during operation. In contrast, fan carrier assemblies that include fixed plug positioning may be unable to be used for some fan locations that include receptacles that are not complementary to the fixed plug positioning of the fan carrier assemblies.

Figure 1B:
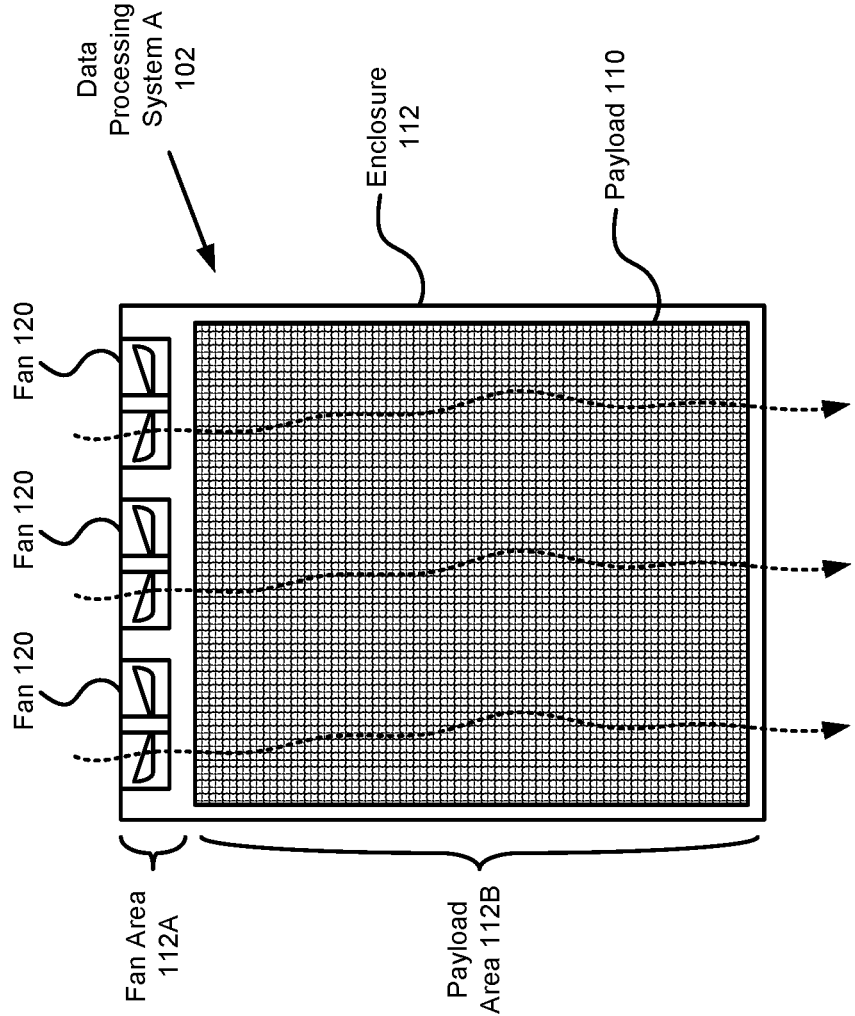
FIG. 1B shows a first top view diagram illustrating gas flow in a data processing system in accordance with an embodiment.

By doing so, embodiments disclosed herein may provide a data processing system that is more likely to be able to provide desired computer implemented services through reduced time, cost, and/or other considerations for assembly of the data processing system. Refer to FIG. 1B for additional details regarding flows of gas within data processing system, FIG. 1C for additional details regarding locations in which fans may be positioned to generate the flows of gas, and FIGS. 1D-1L for additional details regarding components of data processing systems 100 that may facilitate compatibility of fan carrier assemblies with locations having varying geometries.

Any of data processing systems 100 may be implemented using a computing device such as a host or server, a personal computer (e.g., desktops, laptops, and tablets), a "thin" client, a personal digital assistant (PDA), a Web enabled appliance, a mobile phone (e.g., Smartphone), and/or any other type of computing device or system. For additional details regarding computing devices, refer to FIG. 2.

The system of FIG. 1A may include any number and types of data processing systems 100. Any of the aforementioned devices may operate independently and/or cooperatively to provide computer implemented services. Data processing systems 100 may provide such services to, for example, user of the data processing systems 100, to other data processing systems 100, and/or to other devices not shown in FIG. 1A.

Data processing systems 100 may be operably connected to any of each other and/or other devices via a communication system (not shown). The communication system may include one or more networks that facilitate communication between data processing systems 100 (or portions thereof) and/or other devices. The networks may include, for example, wired networks, wireless network, public networks, private network, the Internet, etc.

While illustrated in FIG. 1A as including a limited number of specific components, a system in accordance with an embodiment may include fewer, additional, and/or different components than those illustrated therein.

As noted above, the hardware component of data processing systems may generate heat that may need to be dissipated for the hardware components to continue to operate and provide desired computer implemented services. FIG. 1B shows an example of airflows (e.g., flows of any types/combinations of gasses) that may be used to dissipate heat from hardware components.

Turning to FIG. 1B, a first top view diagram of data processing system A 102 in accordance with an embodiment is shown. Any of data processing systems 100 may be similar to data processing system A 102.

As seen in FIG. 1B, data processing system A 102 may include payload 110, enclosure 112, and any number of fans (e.g., 120). Each of these components is discussed below.

Enclosure 112 may include a chassis usable to house other components of data processing system A 112. The chassis may be any type of chassis. For example, the chassis may be a rack mount chassis, a sled, and/or other type of structure for housing components of a data processing system.

Generally, enclosure 112 may be implemented with a physical structure including one or more areas in which payload 110, fans (e.g., 120), and/or other components may be positioned. For example, enclosure 112 may include fan area 112A in which fans may be positioned and payload area 112B in which payload 110 may be positioned.

Payload 110 may include any number and types of hardware components. The hardware components may, at least in part, provide the computer implemented services offered by data processing system A 102. Any of the hardware components of data processing system A may be a temperature sensitive hardware component. Payload 110 may be positioned in payload area 112B.

To manage the temperatures of the temperature sensitive hardware components, any number of fans (e.g., 120) may be positioned in fan area 112A. The fans may selectively generate a flow of gas (e.g., illustrated in FIG. 1B with wavy dashed lines terminating in arrows, top to bottom of the page). The flow of gas may flow proximate to payload 110 thereby facilitating thermal exchange which may cool any of the hardware components of payload 110. While not shown in FIG. 1B, data processing system A 102 may include other types of thermal management components (e.g., temperature sensors, controllers, etc.) to orchestrate when and at what rate to generate the flow of the gas.

While illustrated in FIG. 1B with respect to a single fan area positioned near one end of enclosure 112, a data processing system may include any number of fan areas positioned anywhere within enclosure 112 without departing from embodiments disclosed herein.

To generate the flows of gas, the fans may need to obtain electrical power. To do so, the areas in which fans may be positioned may include receptacles through which power may be obtained. For example, a plug of a fan may be connected to a receptacle, and the receptacle may be connected to a power supply or other power source via a power distribution system. Thus, while a plug is connected to a receptacle, power may be provided to a corresponding fan.

Figure 1C:
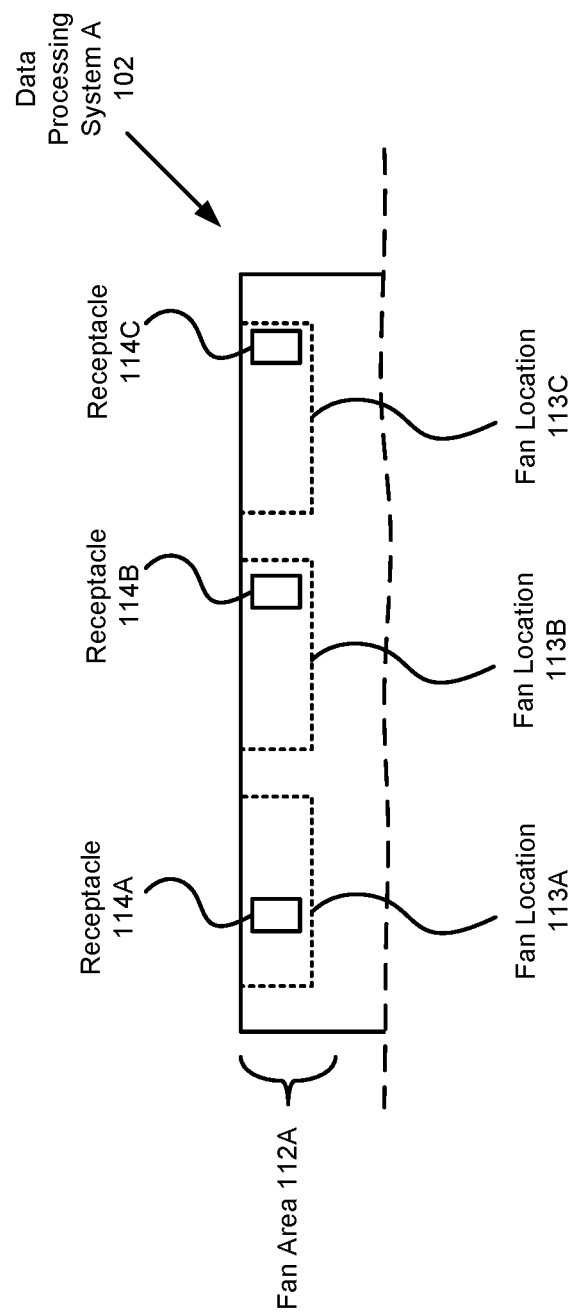
FIG. 1C shows a second top view diagram illustrating fan locations in a data processing system in accordance with an embodiment.

Turning to FIG. 1C, a second top view diagram of data processing system A 102 in accordance with an embodiment is shown. In FIG. 1C, the fans are removed to illustrate fan locations 113A-113C in which fans may be positioned.

Each of the fan locations may include a receptacle (e.g., 114A-114C) through which power may be provided to a corresponding fan. However, the relative location of each receptacle within a fan area may vary. For example, as seen in FIG. 1C, the relative location of receptacle 114A may be towards a left hand side of fan location 113A while the locations of other receptacles 114B, 114C may be toward a right hand side of other fan locations 113B, 113C. To obtain power from these receptacles, a plug for a fan may need to be aligned and inserted into the receptacles. To do so, embodiments disclosed herein may provide a fan carrier assembly that facilitates automatic alignment and insertion of plugs into receptacles positioned in fan locations. Consequently, the disclosed fan carrier assemblies may be adaptable for compatibility with various fan locations that may include receptacles at varying relative positions within the fan locations.

To further clarify aspects of data processing systems, FIGS. 1D-1L show diagrams of various features of a data processing system in accordance with an embodiment.

Figure 1D:
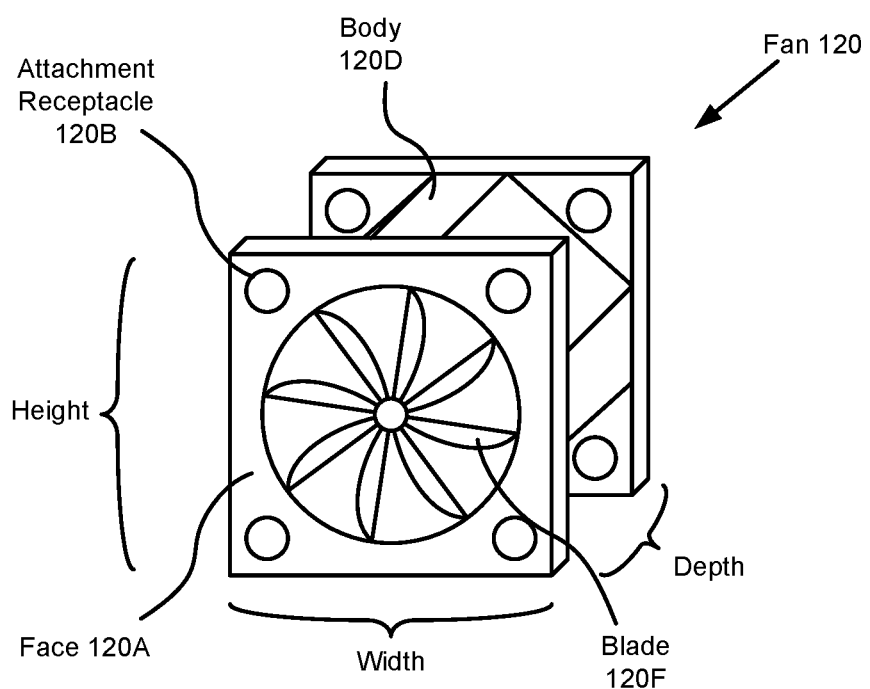
FIG. 1D shows a diagram of a fan in accordance with an embodiment.

Turning to FIG. 1D a diagram of fan 120 in accordance with an embodiment is shown. As noted above, fan 120 may selectively generate flows of gasses.

To do so, fan 120 may include any number of blades (e.g., 114F), a motor (not shown) coupled to the blades, a wiring harness (not shown) to obtain electrical power, etc. (e.g., in aggregate the "active components").

To orient and position fan 120 (e.g., to direct the gas flow), fan 120 may include body 120D in which the active components are positioned. Body 120D may be a physical structure (e.g., such as a plastic injection molded part), and may include faces (e.g., 120A) through which a flow of gas is generated. Attachment receptacles (e.g., 120B) may be positioned on the faces to facilitate reversible connection and alignment of body 120D with other structures. Attachment receptacles 120B may include, for example, holes through which bolts, connectors, pins, raised members, and/or other structures may be positioned.

Fan 120 may include an electric motor connected to any number of blade 120F. When power is obtained, electric motor may rotate blade 120F thereby generating a flow of gas.

While illustrated in FIG. 1D with a limited number of specific components in specific location and orientations, a fan may include additional, fewer, and/or different components in different positions/orientation than shown in FIG. 1D without departing from embodiments disclosed herein.

Figure 1E:
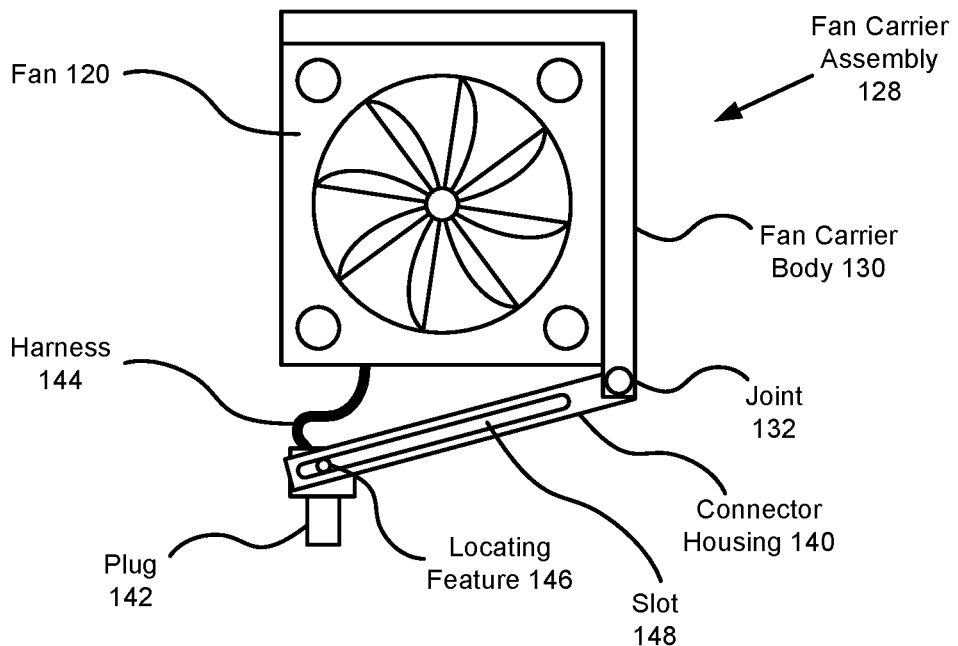
FIGS. 1E-1L show front view diagrams of fans, fan carrier assemblies, and fan locations in accordance with an embodiment.

To manage the position of a plug used to provide fan 120 with power, a fan carrier assembly may be used. Turning to FIG. 1E, a first front view diagram of fan 120 and fan carrier assembly 128 in accordance with an embodiment is shown.

Fan carrier assembly 128 may be a physical structure. The physical structure may be used to house, at least in part, fan 120. Additionally, the physical structure may facilitate automatic positioning of plug 142 during attachment to receptacles. When attached, plug 142 may provide power to electrical motors or other active components of fan 120. For example, plug 142 may be connected to the active components via harness 144 (e.g., a wire harness) thereby facilitating power from a receptacle to the active components.

Fan carrier assembly 128 may include fan carrier body 130 and connector housing 140. Each of these components is discussed below.

Fan carrier body 130 may facilitate positioning of fan 120 with respect to a fan location. For example, fan carrier body 130 may be implemented with a structure in which fan 120 may be positioned. The structure may include any number of walls that surround one or more sides of fan 120. The structure may be physically connected to fan 120 via one or more connections (not shown).

The structure may be implemented using, for example, plastic injection molded plastic components, machined metal components, and/or other types of structures.

Connector housing 140 may facilitate flexible automatic positioning of plug 142. For example, to generate desired airflows, fan 120 may need to be positioned at and oriented with respect to a particular fan location/orientation. A receptacle for the fan location may be available, but the receptacle may not be positioned at a specific location with respect to the fan location. Thus, unless plug 142 is able to be flexibly positioned with respect to the fan location, plug 142 may not be able to connect to the receptacle.

To provide for flexible and automatic positioning of plug 142, connector housing 140 may include a pair of bars or other structures, a slot (e.g., 148) in each of the bars, and a locating feature (e.g., 146) for each slot. Each of these components of connector housing 140 is discussed below.

The bars may be implemented using, for example, plates of material separated from one another by a width of plug 142 thereby allowing a portion of plug 142 to be positioned between the bars. The bars may be connected to fan carrier body 130 via joint 132 thereby allowing connector housing 140 to rotate with respect to fan carrier body 130 and fan 120. The rotation of connector housing 140 may, at least in part, facilitate repositioning of plug 142 with respect to fan 120.

Slot 148 may be implemented as a slot in one of the bars. Similar slots may be present in each of the bars thereby establishing a pair of slots separated from one another by a width of plug 142.

Locating feature 146 may be implemented using a pin or other structure which may be positioned within slot 148. The pin may extend from a surface of plug 142, or another structure attached to a surface of plug 142. For example, an adapter plate or other structure may attach to plug 142. When implemented using a pin, locating feature 146 may include a pair of pins corresponding to the slots of the bars. The pins may freely slide along the slots thereby allowing plug 142 to freely move along a path defined by slot 148.

Figure 1F:
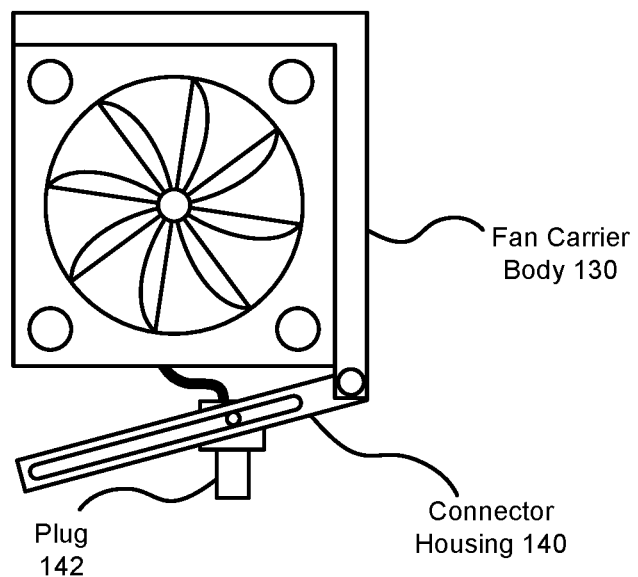

For example, turning to FIG. 1F, a second front view diagram of fan 120 and fan carrier assembly 128 in accordance with an embodiment is shown. In contrast to FIG. 1E, in FIG. 1F force has been applied to plug 142 causing plug 142 to move along the path defined by slot 148. Thus, as seen in FIG. 1F, connector housing 140 may provide flexibility in positioning of plug 142 with receptacles in various locations within a fan location.

Returning to the discussion of FIG. 1E, while not shown, connector housing 140 may include a return feature such as a spring or other structure that applies force to plug 142 to return it to the first position or the second position when other forces are not applied to the plug.

To manage the positioning of plug 142, locating feature 146 may include a portion to which force may be applied when plug 142 is moved toward a receptacle. For example, if implemented using a pin, a portion of the pin may extend out of slot 148. As will be discussed in greater detail below, the extended portion of the pin may establish an interference with a drive feature positioned with a fan location while plug 142 is moved towards a receptacle. The interference may apply force to the pin which may move plug 142 to align it with the receptacle.

Figure 1G:
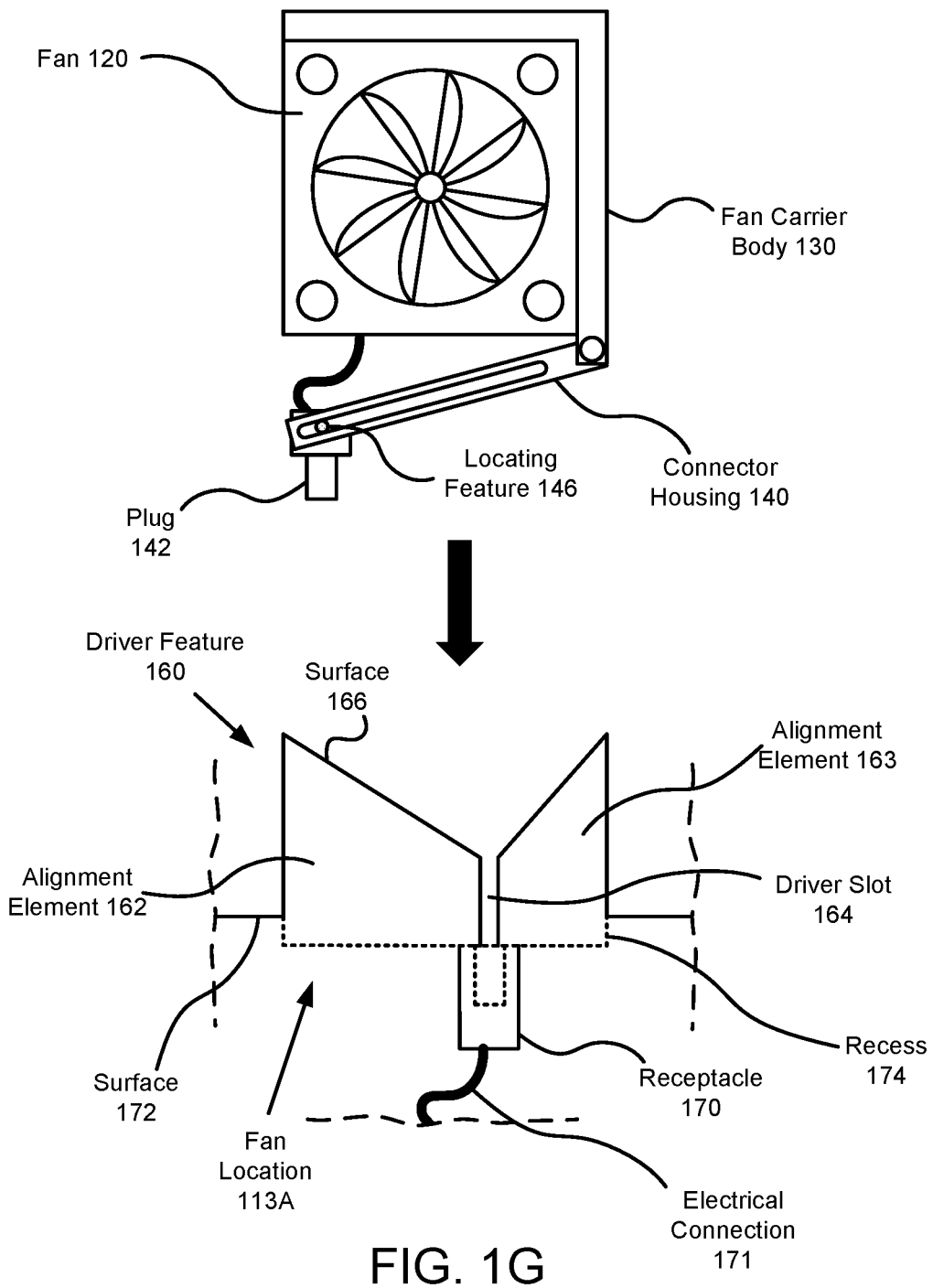

Turning to FIG. 1G, a third front view diagram of fan 120, fan carrier assembly 128, and fan location 113A in accordance with an embodiment is shown.

To provide power to fan 120, receptacle 170 may be positioned in fan location 113A on surface 172. Surface 172 may correspond to any type of structure such as, for example, a carrier positioned in a chassis, a portion of a circuit card or other structure, a portion of a chassis, etc.

Surface 172 may include various features (e.g., recess 174, pins, blocks, etc.) for positioning and orienting fan 120 with respect to fan location 113A. These feature may restrict the position and orientation of fan 102 with respect to fan location 113A. Thus, fan 120 may need to be placed in fan location 113A in a predetermined position and orientation.

Receptacle 170 may be positioned at various locations within fan location 113A. As discussed above, connector housing 140 may provide for flexibility of positioning plug 142 with respect to fan 120. Thus, connector housing 140 may allow for plug 142 to move into alignment with receptacle 170 during approaches of an 120 to fan location 113A. When positioned in fan location 113A, electrical connection 171 may allow power to flow to fan 120 from a power supply or other power providing entity.

To facilitate automatic positioning of plug 142 with respect to receptacle 170, drive feature 160 may be positioned with fan location 113A. Drive feature 160 may include a physical structure that establishes an interference with locating feature 146 during approaches of fan 120 toward fan location 113A.

For example, drive feature 160 may include one or more of alignment element 162 (and/or other alignment element 163). Alignment element 162 may be a structure that includes a skewed surface (e.g., 166) with respect to a direction of approach of fan 120 to fan location 113A. The skewed surface may apply force to locating feature 146 during the approach. The force may direct locating feature 146 to driver slot 164. Driver slot 164 may be aligned with receptacle 170. Refer to FIGS. 1H-1K for additional details regarding approaches of fans toward fan locations.

Alignment element 162 may be implemented using, for example, sheet of material, a bar, and/or other structures. A pair of alignment element 162 may be positioned with fan location 113A. The pair may be separated from each other by a thickness of fan 120 and/or fan carrier assembly 128. Thus, during an approach, fan 120 and fan carrier assembly 128 may be positioned between the pair. For example, in FIG. 1G, a second alignment element may be positioned into the page by the thickness, and during an approach fan 120 and fan carrier assembly 128 may move into a slot between the pair of alignment elements.

While locating feature is illustrated in FIG. 2G as only including a single pin on each side of plug 142, it will be appreciated that locating feature 146 may include other structures to, for example, align plug 142 with receptacle 170. For example, multiple pins may be positioned on respective sides of plug 142. The pins on one side of plug 142 may be positioned in a line or other formation such that plug 142 is rotated into alignment with receptacle 170. For example, the multiple pins may establish multiple interferences with driver slot 164 thereby rotating plug 142 into alignment with receptacle 170 (e.g., in addition to positioning plug 142 above receptacle 170).

To further clarify interaction between connector housing 140 and alignment features positioned with a fan location, phases of an approach of fan 120 toward fan location 113A are shown in FIGS. 1H-1K.

Figure 1H:
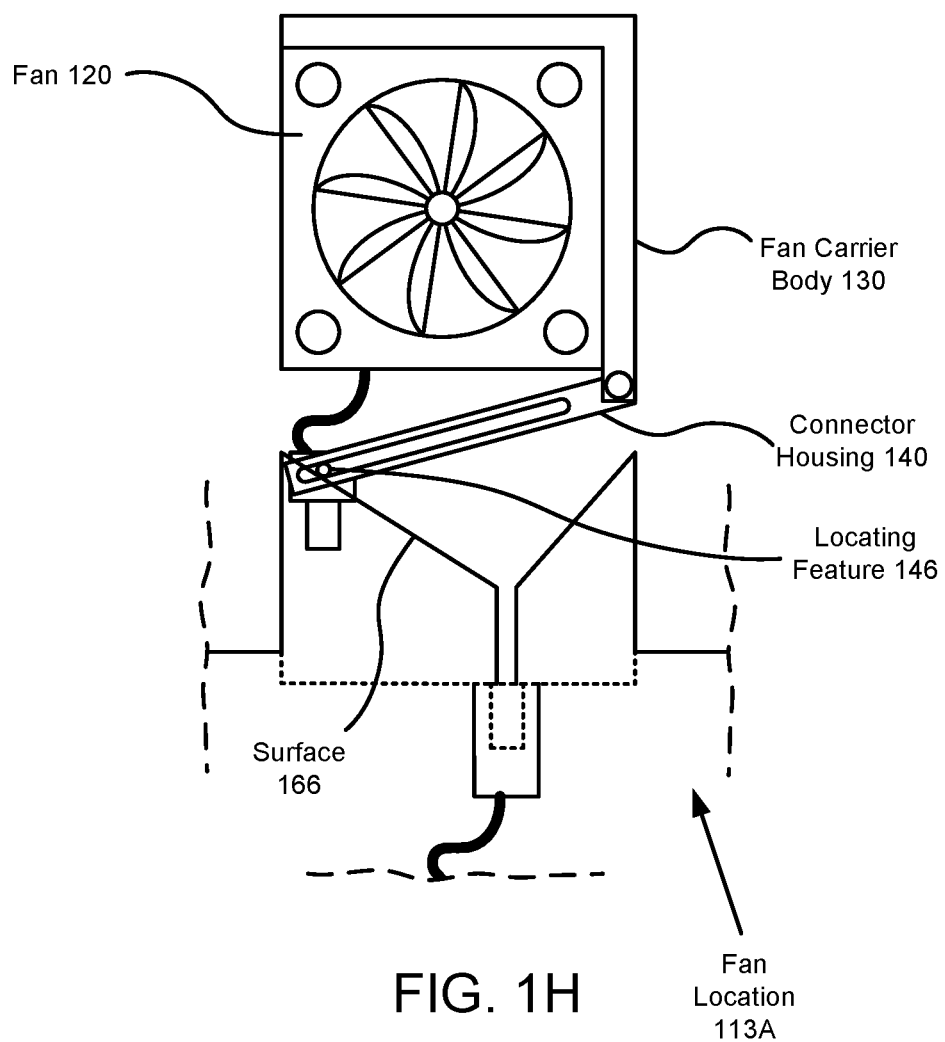

Turning to FIG. 1H, a fourth front view diagram of fan 120, fan carrier assembly 128, and fan location 113A in accordance with an embodiment is shown. In FIG. 1H, a first phase of an approach is shown where locating feature 146 makes contact with surface 166. The contact may establish an interference between surface 166 and locating feature 146 directed toward a driver slot.

Figure 1I:
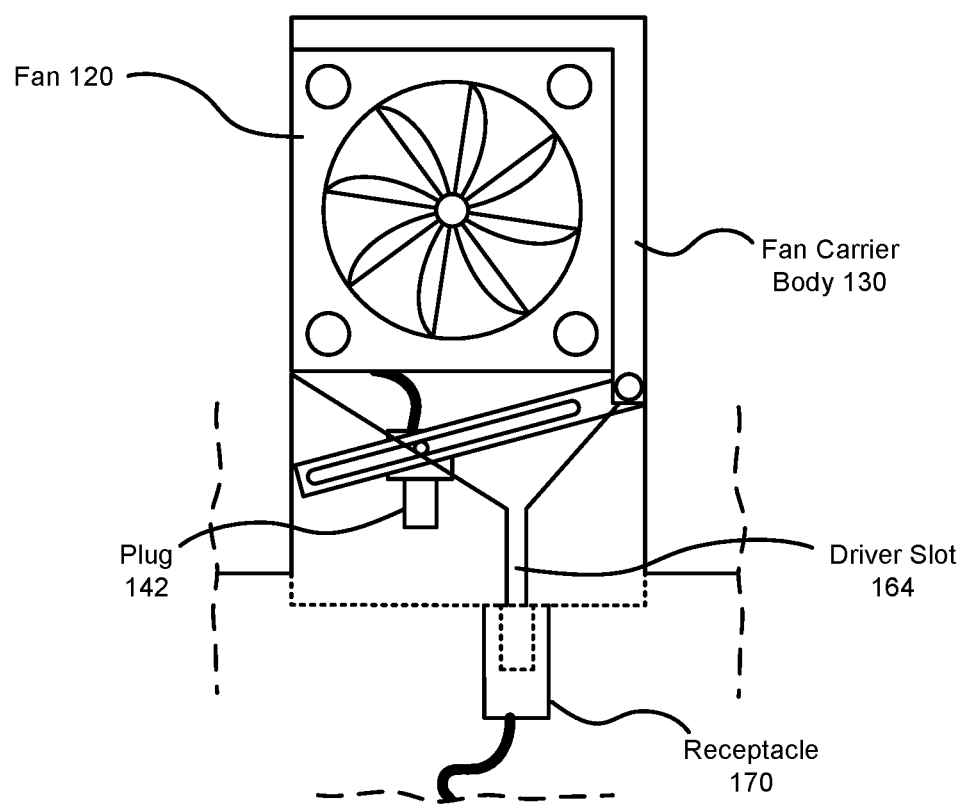

Turning to FIG. 1I, a fifth front view diagram of fan 120, fan carrier assembly 128, and fan location 113A in accordance with an embodiment is shown. In FIG. 1I, a second phase of an approach is shown where force applied to locating feature 146 due to the interference discussed with respect to FIG. 1H causes plug to move toward driver slot 164 thereby improving but not yet completing alignment of plug 142 with receptacle 170.

Figure 1J:
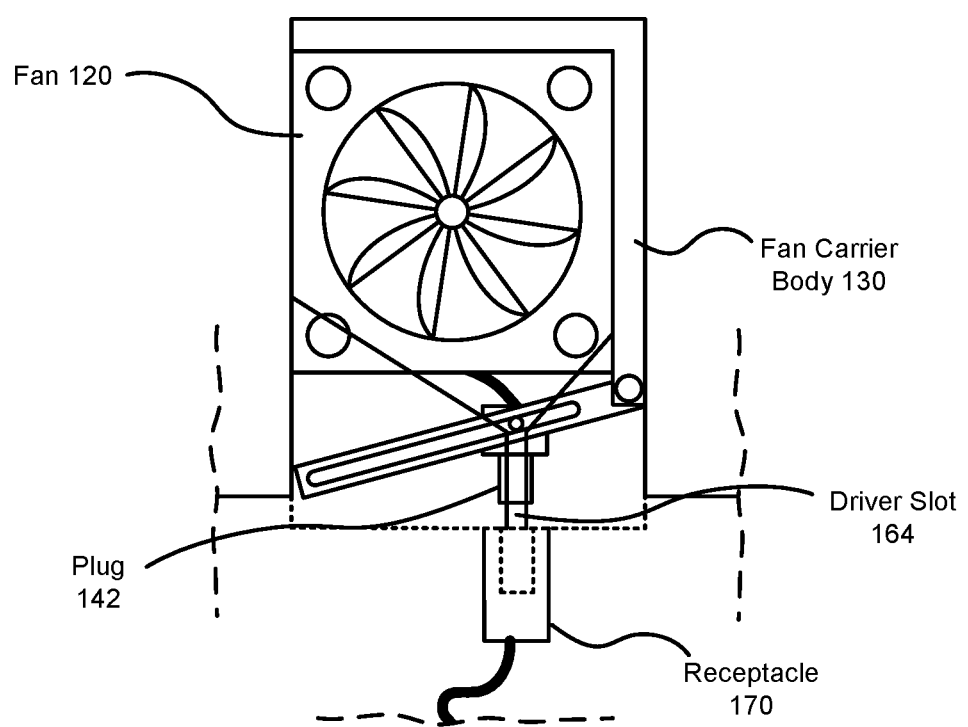

Turning to FIG. 1J, a sixth front view diagram of fan 120, fan carrier assembly 128, and fan location 113A in accordance with an embodiment is shown. In FIG. 1J, a third phase of an approach is shown where force applied to locating feature 146 due to the interference discussed with respect to FIG. 1H causes plug to move into alignment with driver slot 164 completing alignment of plug 142 with receptacle 170. Once aligned, the interference between the locating feature and surface of the alignment element may be relieved. Consequently, as the approach is continued, plug 142 may be maintained in alignment with receptacle 170 (e.g., by the side walls of driver slot 164.

Figure 1K:
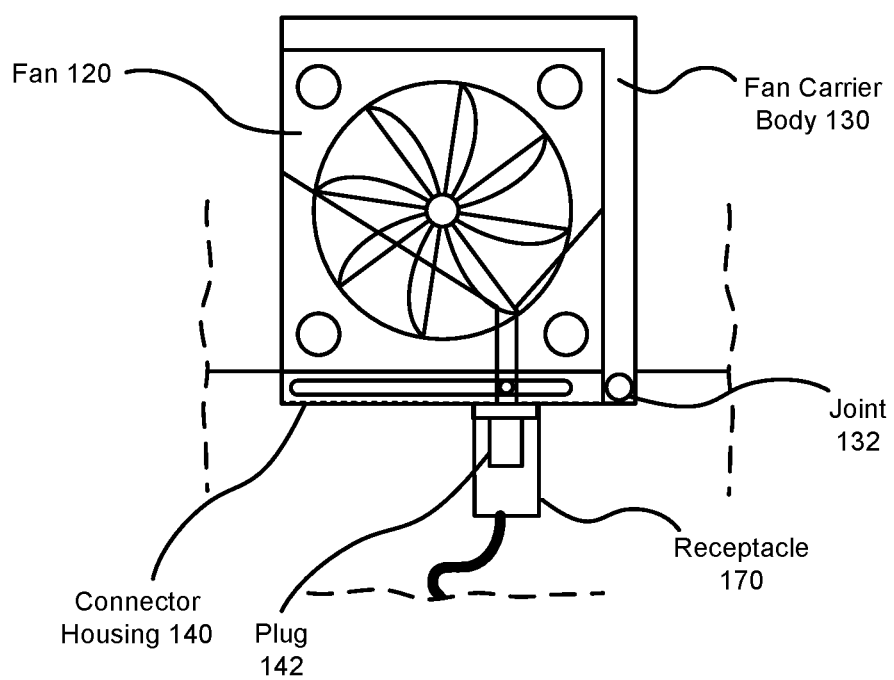

Turning to FIG. 1K, a seventh front view diagram of fan 120, fan carrier assembly 128, and fan location 113A in accordance with an embodiment is shown. In FIG. 1K, a fourth phase of an approach is shown. During the fourth phase, plug 142 may mate with receptacle 170 while the two are aligned with one another. Additionally, connector housing 140 may rotate about joint 132.

Thus, via the process shown in FIGS. 1H-1K, plug 142 may be automatically aligned with receptacle 170 during approaches of fan 120 toward a fan location. Consequently, fan carrier assembly 128 may be compatible for use with fan locations of varying topology.

Figure 1L:
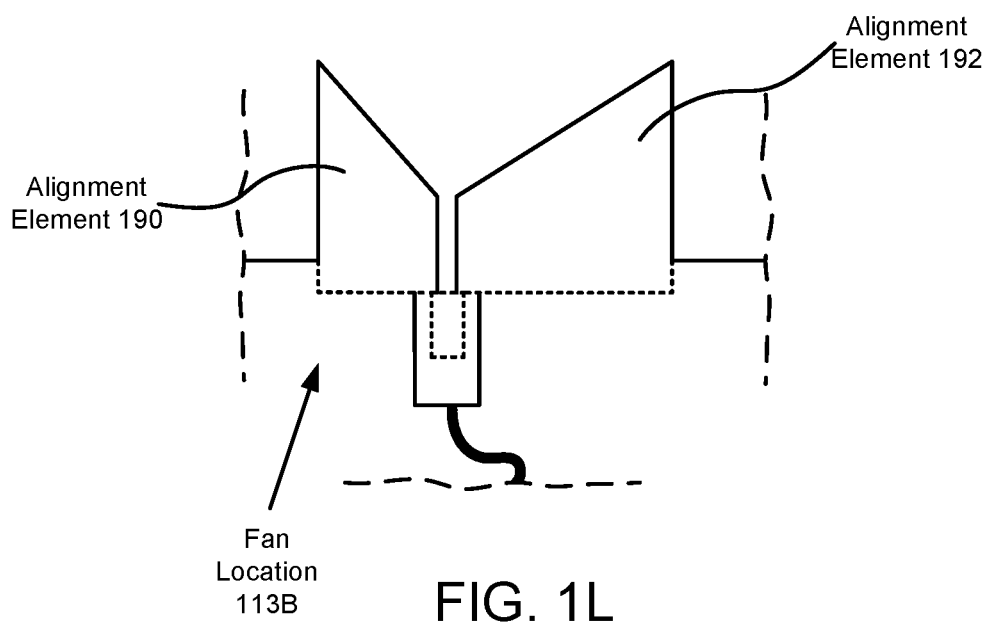

For example, turning to FIG. 1L, an eight front view diagram of fan location 113B in accordance with an embodiment is shown. As seen in FIG. 1L, fan location 113B may have a different topology from that of fan location 113A.

For example, fan location 113B may include a receptacle located at a different position within fan location 113B from that of receptacle 170, and may include different alignment elements (e.g., 190, 192). By providing for flexibility in plug positioning, fan carrier assembly 128 may be used in conjunction with these and other types of fan location topologies.

While illustrated in FIG. 1E-1L as being separate structures, it will be appreciated that the alignment elements may be integrated with other structures. For example, the alignment elements may be portions of fan retention mechanisms or other structures used to retain fans in place. Additionally, while illustrated as being solid, it will be appreciated that the alignment elements may include holes or may be formed from permeable materials, screens, or other structures thereby allowing for airflow around and/or through the alignment elements.

As discussed with respect to FIG. 1A, data processing systems 100 may be implemented with a computing device. For example, the payload positioned in a payload area of an enclosure (e.g., a chassis) of a data processing system may include a computing device. The computing device may provide computer implemented services to users of the data processing system and/or other devices operably connected to the data processing system. The computing device may be modularized. For example, hardware components of the computing device may be divided into modules that may be interconnected with one another. The modules may include, for example, host processor modules, secure control modules, and/or other types of modules. The modules may include hardware components that provide different functionalities. For example, the host processor modules may provide data processing functionality while the secure control modules may provide management and/or security functionality (e.g., by hosting management controllers).

Figure 2:
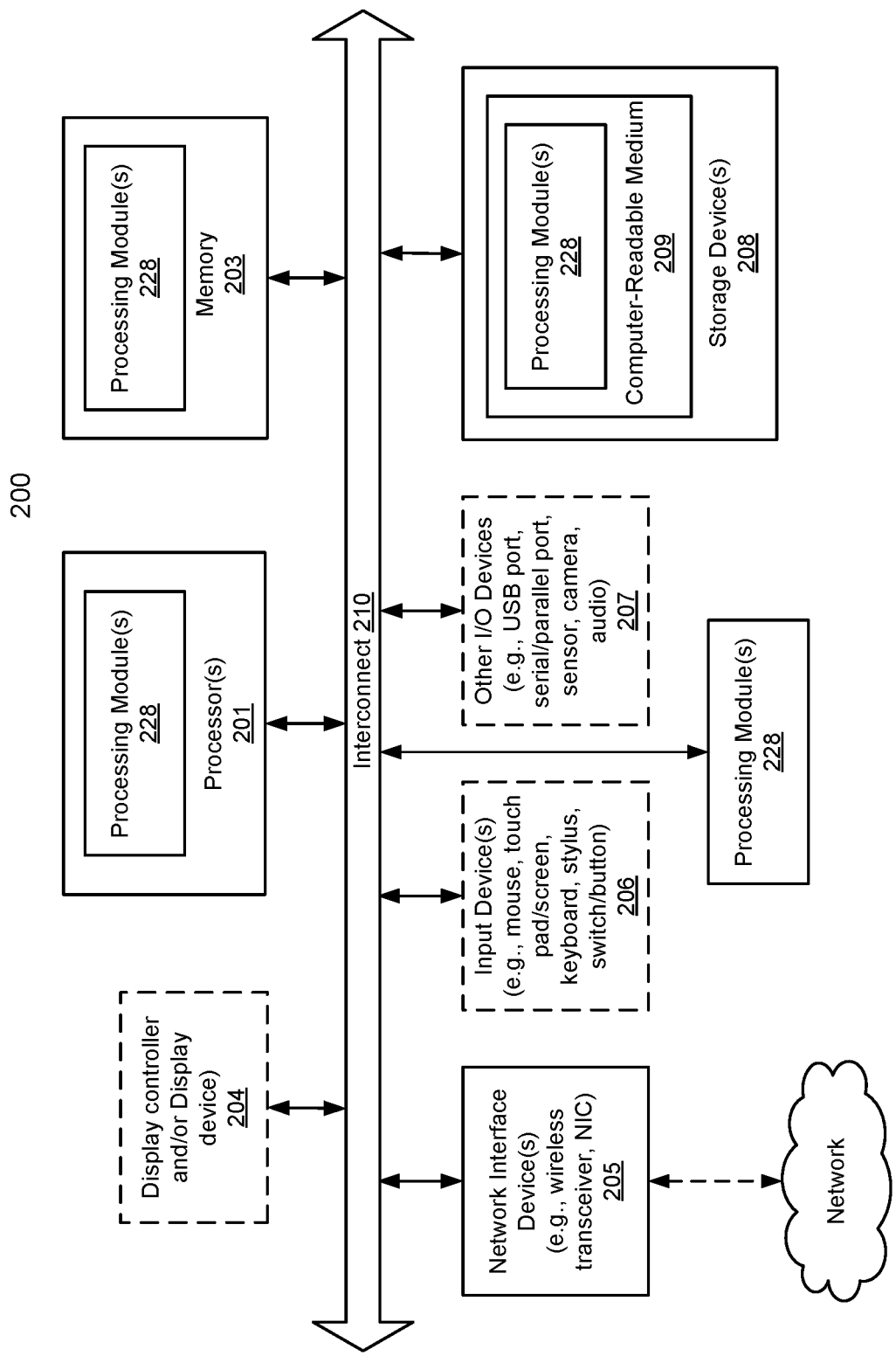
FIG. 2 shows a block diagram illustrating a computing device in accordance with an embodiment.

Turning to FIG. 2, a block diagram illustrating an example of a computing device in accordance with an embodiment is shown. For example, system 200 may represent any of the data processing systems and/or computing devices described above performing any of the processes or methods described above. System 200 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 200 is intended to show a high-level view of many components of the computer system. However, it is to be understood that additional components may be present in certain implementations and furthermore, different arrangement of the components shown may occur in other implementations. System 200 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 200 includes processor 201, memory 203, and devices 205-208 via a bus or an interconnect 210. Processor 201 may represent a single processor or multiple processors with a single processor core or multiple processor cores included therein. Processor 201 may represent one or more general-purpose processors such as a microprocessor, a central processing unit (CPU), or the like. More particularly, processor 201 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 201 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 201, which may be a low power multi-core processor socket such as an ultra-low voltage processor, may act as a main processing unit and central hub for communication with the various components of the system. Such processor can be implemented as a system on chip (SoC). Processor 201 is configured to execute instructions for performing the operations discussed herein. System 200 may further include a graphics interface that communicates with optional graphics subsystem 204, which may include a display controller, a graphics processor, and/or a display device.

Processor 201 may communicate with memory 203, which in one embodiment can be implemented via multiple memory devices to provide for a given amount of system memory. Memory 203 may include one or more volatile storage (or memory) devices such as random access memory (RAM), dynamic RAM (DRAM), synchronous DRAM (SDRAM), static RAM (SRAM), or other types of storage devices. Memory 203 may store information including sequences of instructions that are executed by processor 201, or any other device. For example, executable code and/or data of a variety of operating systems, device drivers, firmware (e.g., input output basic system or BIOS), and/or applications can be loaded in memory 203 and executed by processor 201. An operating system can be any kind of operating systems, such as, for example, Windows® operating system from Microsoft®, Mac OS®/iOS® from Apple, Android® from Google®, Linux, Unix®, or other real-time or embedded operating systems such as VxWorks.

System 200 may further include IO devices such as devices (e.g., 205, 206, 207, 208) including network interface device(s) 205, optional input device(s) 206, and other optional IO device(s) 207. Network interface device(s) 205 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 206 may include a mouse, a touch pad, a touch sensitive screen (which may be integrated with a display device of optional graphics subsystem 204), a pointer device such as a stylus, and/or a keyboard (e.g., physical keyboard or a virtual keyboard displayed as part of a touch sensitive screen). For example, input device(s) 206 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 207 may include an audio device. An audio device may include a speaker and/or a microphone to facilitate voice-enabled functions, such as voice recognition, voice replication, digital recording, and/or telephony functions. Other IO devices 207 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 207 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 210 via a sensor hub (not shown), while other devices such as a keyboard or thermal sensor may be controlled by an embedded controller (not shown), dependent upon the specific configuration or design of system 200.

To provide for persistent storage of information such as data, applications, one or more operating systems and so forth, a mass storage (not shown) may also couple to processor 201. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 201, e.g., via a serial peripheral interface (SPI). This flash device may provide for non-volatile storage of system software, including a basic input/output software (BIOS) as well as other firmware of the system.

Storage device 208 may include computer-readable storage medium 209 (also known as a machine-readable storage medium or a computer-readable medium) on which is stored one or more sets of instructions or software (e.g., processing module, unit, and/or processing module/unit/logic 228) embodying any one or more of the methodologies or functions described herein. Processing module/unit/logic 228 may represent any of the components described above. Processing module/unit/logic 228 may also reside, completely or at least partially, within memory 203 and/or within processor 201 during execution thereof by system 200, memory 203 and processor 201 also constituting machine-accessible storage media. Processing module/unit/logic 228 may further be transmitted or received over a network via network interface device(s) 205.

Computer-readable storage medium 209 may also be used to store some software functionalities described above persistently. While computer-readable storage medium 209 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 228, components and other features described herein can be implemented as discrete hardware components or integrated in the functionality of hardware components such as ASICS, FPGAs, DSPs or similar devices. In addition, processing module/unit/logic 228 can be implemented as firmware or functional circuitry within hardware devices. Further, processing module/unit/logic 228 can be implemented in any combination hardware devices and software components.

Note that while system 200 is illustrated with various components, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data processing system that provides computer implemented services, the data processing system comprising:
   a payload comprising hardware components that provides the computer implemented services;
   a fan to cool the payload while the hardware components are providing the computer implemented services; and
   a fan carrier assembly adapted to position a plug through which the fan obtains power to operate, the fan carrier assembly comprising:
      a connector housing adapted to reposition the plug between a first position and a second position with respect to a body of the fan, the connector housing being rotatably connected to the fan via the fan carrier assembly.

2. The data processing system of claim 1, wherein connector housing comprises:
   a slot; and
   a locating feature directly attached to a surface of the plug and that extends outward from the surface of the plug, wherein the locating feature is positioned in the slot.

3. The data processing system of claim 2, wherein the slot restricts motion of the plug to a path between the first position and the second position.

4. The data processing system of claim 3, wherein the slot and the locating feature facilitate free translation of the plug along the path.

5. The data processing system of claim 4, wherein the locating feature comprises a pin positioned in the slot, and the pin comprises an interface portion that extends out of the slot.

6. The data processing system of claim 1, further comprising:
   a driver feature adapted to align the plug with a receptacle from which the power is available.

7. The data processing system of claim 6, wherein the driver feature aligns the plug with the receptacle during an approach of the fan carrier toward a fan location in which the receptacle is positioned.

8. The data processing system of claim 7, wherein the fan location defines an area in which the fan is positioned.

9. The data processing system of claim 7, wherein the locating feature comprises:
   an alignment feature comprising a surface that:

is skewed with respect to a direction the approach of the fan carrier; and makes an interference with the interface portion during the approach, the interference applying a force to the plug via the interface portion.

10. The data processing system of claim 9, wherein the force translates the plug to the first position or the second position during the approach to align the plug with the receptacle.

11. The data processing system of claim 10, wherein completion of the approach connects the plug with the receptacle while aligned.

12. The data processing system of claim 11, wherein the connector housing defines a bottom surface that is opposite of the receptacle during the approach.

13. The data processing system of claim 1, wherein the connector housing further comprises:
  a return mechanism adapted to return the plug to the first position or the second position while the force is not applied to the plug.

14. An enclosure for a data processing system, comprising:
  a payload area adapted to house a payload of hardware components for providing computer implemented services;
  a fan to cool the payload while the hardware components are providing the computer implemented services; and
  a fan carrier assembly adapted to position a plug through which the fan obtains power to operate, the fan carrier assembly comprising:
    a connector housing adapted to reposition the plug between a first position and a second position with respect to a body of the fan, the connector housing being rotatably connected to the fan via the fan carrier assembly.

15. The enclosure of claim 14, wherein connector housing comprises:
  a slot; and
  a locating feature coupled to the plug, wherein the locating feature is positioned in the slot.

16. The enclosure of claim 15, wherein the slot restricts motion of the plug to a path between the first position and the second position.

17. The enclosure of claim 16, wherein the slot and the locating feature facilitate free translation of the plug along the path.

18. The enclosure of claim 17, wherein the locating feature comprises a pin positioned in the slot, and the pin comprises an interface portion that extends out of the slot.

19. The enclosure of claim 18, further comprising:
  a driver feature adapted to align the plug with a receptacle from which the power is available.

20. The data processing system of claim 1, wherein the fan carrier assembly further comprises:
  a fan carrier body that is attached to and holds the fan within the fan carrier assembly, the connector housing is rotatably connected to the fan via the fan carrier assembly through a rotatable joint that connects the connectable housing to the fan carrier body.

* * * * *

UNITED STATES PATENT AND TRADEMARK OFFICE
CERTIFICATE OF CORRECTION

| | |
|---|---|
| PATENT NO. | : 12,242,318 B2 |
| APPLICATION NO. | : 18/159921 |
| DATED | : March 4, 2025 |
| INVENTOR(S) | : Corey Dean Hartman |

Page 1 of 1

It is certified that error appears in the above-identified patent and that said Letters Patent is hereby corrected as shown below:

In the Claims

Claim 9, Column 15, Line 1, the sentence "with respect to a direction the approach" should instead read -- with respect to a direction of the approach --.

Signed and Sealed this
Twenty-fourth Day of June, 2025

Coke Morgan Stewart
*Acting Director of the United States Patent and Trademark Office*